(12) United States Patent
Liu et al.

(10) Patent No.: US 10,366,910 B2
(45) Date of Patent: Jul. 30, 2019

(54) PICKUP AND PLACING DEVICE AND OPERATION METHOD OF PICKING AND PLACING BY PICKUP AND PLACING DEVICE

(71) Applicant: Innolux Corporation, Miao-Li County (TW)

(72) Inventors: Tung-Kai Liu, Miao-Li County (TW); Tsau-Hua Hsieh, Miao-Li County (TW); Bo-Feng Chen, Miao-Li County (TW); Hui-Chieh Wang, Miao-Li County (TW)

(73) Assignee: Innolux Corporation, Miao-Li County (TW)

( * ) Notice: Subject to any disclaimer, the term of this patent is extended or adjusted under 35 U.S.C. 154(b) by 0 days.

(21) Appl. No.: 15/604,609

(22) Filed: May 24, 2017

(65) Prior Publication Data
US 2017/0345692 A1 Nov. 30, 2017

(30) Foreign Application Priority Data
May 26, 2016 (CN) .......................... 2016 1 0355532

(51) Int. Cl.
*H01L 21/67* (2006.01)
*H05K 3/00* (2006.01)
*H01L 25/16* (2006.01)
*H01L 25/075* (2006.01)
*H01L 33/62* (2010.01)
(Continued)

(52) U.S. Cl.
CPC .... *H01L 21/67144* (2013.01); *H01L 25/0753* (2013.01); *H01L 25/167* (2013.01); *H01L 33/0079* (2013.01); *H01L 33/62* (2013.01); *H05K 1/115* (2013.01); *H05K 3/0026* (2013.01); *H05K 3/4038* (2013.01); *H01L 2224/16225* (2013.01); *H01L 2224/95* (2013.01); *H01L 2933/0066* (2013.01)

(58) Field of Classification Search
CPC .......... H01L 21/67144; H01L 33/0079; H01L 25/0753; H01L 33/62; H01L 25/167; H01L 2933/0066; H05K 3/4038; H05K 3/0026; H05K 1/115
USPC ........................................... 438/28
See application file for complete search history.

(56) References Cited

U.S. PATENT DOCUMENTS

| 2011/0207253 A1* | 8/2011 | Yang | ................... H01L 25/0753 438/28 |
| 2013/0126081 A1* | 5/2013 | Hu | ......................... H01L 24/75 156/249 |

(Continued)

Primary Examiner — Caleen O Sullivan
(74) Attorney, Agent, or Firm — JCIPRNET

(57) ABSTRACT

The current disclosure provides a pickup and placing device including a control element, a substrate and a pickup structure. The substrate has an upper surface and a lower surface opposite to each other and a plurality of conductive via structures, wherein the conductive via structures are electrically connected to the control element. The pickup structure includes a plurality of pickup heads used for picking up or placing a plurality of light emitting diodes respectively. The pickup structure is disposed on the lower surface of the substrate or disposed in the substrate and extended outside the substrate, and the substrate is disposed between the control element and the pickup structure, wherein the pickup heads are electrically connected to the conductive via structures.

10 Claims, 9 Drawing Sheets

(51) Int. Cl.
  *H01L 33/00*   (2010.01)
  *H05K 3/40*    (2006.01)
  *H05K 1/11*    (2006.01)

(56) References Cited

U.S. PATENT DOCUMENTS

2014/0159066 A1* 6/2014 Hu ...................... H01L 25/0753
                                                              257/88
2016/0155892 A1* 6/2016 Li ........................... H01L 24/00
                                                              257/89

* cited by examiner

PICKUP AND PLACING DEVICE AND OPERATION METHOD OF PICKING AND PLACING BY PICKUP AND PLACING DEVICE

CROSS-REFERENCE TO RELATED APPLICATION

This application claims the priority benefit of Chinese application serial no. 201610355532.6, filed on May 26, 2016. The entirety of the above-mentioned patent application is hereby incorporated by reference herein and made a part of this specification.

BACKGROUND OF THE DISCLOSURE

1. Field of the Disclosure

The present disclosure is related to a pickup and placing device and an operation method of picking and placing by a pickup and placing device, and more particularly, to a pickup and placing device used for picking up and placing the light emitting diode and an operation method of picking and placing by a pickup and placing device.

2. Description of Related Art

The current pickup and placing device for the light emitting diode picks up all the light emitting diodes on the wafer or the carrier board all together through vacuum suction and places the light emitting diodes on another carrier board or circuit board at the same time. Because of the variation of the production processes, the optical properties (such as the luminescent efficiency, luminescence type and so on) of each of the light emitting diodes on the wafer or the carrier board are not necessarily the same. Therefore, the light emitting diodes on the other carrier board or circuit board can not have the same or similar optical properties, and the optical display performance of the product is poor.

SUMMARY OF DISCLOSURE

The present disclosure provides a pickup and placing device and an operation method of picking and placing by a pickup and placing device. In the present disclosure, the selected light emitting diodes can be selectively picked up and placed. And the selected light emitting diode have the same or similar optical properties.

The pickup and placing device of the present disclosure includes a control element, a substrate and a pickup structure. The substrate has an upper surface and a lower surface opposite to each other and a plurality of conductive via structures, wherein the conductive via structures are electrically connected to the control element. The pickup structure includes a plurality of pickup heads used for picking up or placing a plurality of light emitting diodes respectively. The pickup structure is disposed on the lower surface of the substrate or disposed in the substrate and extended outside the substrate, wherein the pickup structure is electrically connected to the conductive via structures.

In an embodiment of the present disclosure, the substrate is silicon substrate and the conductive via structures are a plurality of silicon vias.

In an embodiment of the present disclosure, the conductive via structures penetrate the substrate.

In an embodiment of the present disclosure, each of the pickup heads includes a main body portion including a first body portion and a second body portion, wherein a channel is provided between the first body portion and the second body portion, and a pickup portion disposed on the first body portion and second body portion of the main body portion and the pickup portion exposing the channel.

In an embodiment of the present disclosure, a diameter of the pickup portion gradually decreases from the main body portion in a direction away from the main body portion.

In an embodiment of the present disclosure, the pickup structure further include: a carrier including a plurality of chambers and a plurality of conductive elements, wherein the channel is connected to one of the plurality of chambers; and a plurality of controllers disposed in the carrier and electrically connected to the conductive via structures of the substrate through the conductive elements respectively.

In an embodiment of the present disclosure, a height of the pickup portion is between 1 micrometer and 50 micrometers.

In an embodiment of the present disclosure, the main body portion further includes a plurality of metal layers and at least one bonding layer, and the metal layers are alternately stacked with the bonding layer.

In an embodiment of the present disclosure, the pickup heads further include a buffer layer disposed on a surface of the pickup head.

In an embodiment of the present disclosure, the conductive via structures include a plurality of first conductive via structures, a plurality of second conductive via structures, a plurality of third conductive via structures, and a plurality of fourth conductive via structures. The pickup structure further includes: a plurality of electromagnetic elements disposed in the substrate and electrically connected to the second conductive via structures and the third conductive via structures respectively; a plurality of first conductive channels extended from the lower surface to the upper surface of the substrate and connected to the first conductive via structures respectively; and a plurality of second conductive channels extended from the lower surface to the upper surface of the substrate and connected to the fourth conductive via structures respectively, wherein the pickup heads are disposed in correspondence to the electromagnetic elements respectively, and disposed in the substrate and extended outside the substrate, a distance is provided between at least one of the electromagnetic elements and at least one of the corresponding pickup heads, and at least one of the pickup heads is electrically connected to one of the first conductive channels and one of the second conductive channels.

In an embodiment of the present disclosure, the conductive via structures include a plurality of first conductive via structures and a plurality of second conductive via structures. Each of the pickup heads includes a first portion, a second portion, at least one first insulator, a second insulator and a conductive element. The first portion is disposed adjacent to the substrate and located between the substrate and the second portion. The at least one first insulator is disposed between the first portion and the second portion, wherein the first portion, the second portion and the at least one first insulator define a buffer region. The second insulator is disposed on the second portion. The conductive element passes through the first portion, the at least one first insulator and the second portion and partially disposed between the second portion and the second insulator, wherein two ends of the conductive element are electrically connected to one of the first conductive channels and one of the second conductive channels, respectively.

The operation method of picking and placing by the pickup and placing device of the present disclosure includes the following steps. Providing a pickup and placing device including a control element, a substrate and a pickup structure. The substrate has an upper surface and a lower surface opposite to each other and a plurality of conductive via structures, wherein the conductive via structures are electrically connected to the control element. The pickup structure includes a plurality of pickup heads used for picking up or placing a plurality of light emitting diodes respectively, wherein the pickup heads are electrically connected to the conductive via structures. The control element provides a signal, and the signal is transmitted to the pickup structure through the conductive via structures, and the pickup heads of the pickup structure attract the selected light emitting diodes or place the attracted light emitting diodes on an active array substrate.

In an embodiment of the present disclosure, each of the pickup heads includes a main body portion and a pickup portion. The main body portion includes a first body portion and a second body portion, wherein a channel is provided between the first body portion and the second body portion. The pickup portion is disposed on the first body portion and the second body portion of the main body portion and the pickup portion exposes the channel. The pickup structure further includes a carrier, a plurality of controllers, and a plurality of valves. The carrier includes a plurality of chambers and a plurality of conductive elements, wherein the channels are connected to the corresponding chambers, and the controllers are disposed in the carrier and electrically connected to the conductive via structures of the substrate through the conductive elements respectively. The valves are disposed in the chambers respectively. When one of the pickup heads is going to attract one of the corresponding light emitting diodes, the controller controls the valve, and one of the chambers and one of the corresponding channels are connected to each other for attracting one of the corresponding light emitting diodes.

In an embodiment of the present disclosure, one of the controllers makes the valve isolate one of the chambers and one of the corresponding channels, and one of the light emitting diodes is placed on the active array substrate when one of the pickup heads is going to place one of the attracted light emitting diodes on the active array substrate.

In an embodiment of the present disclosure, the conductive via structures include a plurality of first conductive via structures, a plurality of second conductive via structures, a plurality of third conductive via structures, and a plurality of fourth conductive via structures. The pickup structure further includes: a plurality of electromagnetic elements, a plurality of first conductive channels, and a plurality of second conductive channels. The electromagnetic elements are disposed in the substrate and electrically connected to the second conductive via structures and the third conductive via structures respectively. The first conductive channels are extended from the lower surface to the upper surface of the substrate and connected to the first conductive via structures respectively. The second conductive channels are extended from the lower surface to the upper surface of the substrate and connected to the fourth conductive via structures respectively. The pickup heads are disposed in correspondence to the electromagnetic elements respectively, and disposed in the substrate and extended outside the substrate. A distance is provided between at least one of the electromagnetic elements and at least one of the corresponding pickup heads, and at least one of the pickup heads is electrically connected to one of the first conductive channels and one of the second conductive channels. When one of the pickup heads is going to attract one of the light emitting diodes, one of the first conductive via structures, one of the pickup heads, and one of the fourth conductive via structures form a first current path, and one of the pickup heads is magnetic for attracting one of the light emitting diodes.

In an embodiment of the present disclosure, one of the second conductive via structures, one of the electromagnetic elements, and one of the third conductive via structures form a second current path making one of the pickup heads and one of the corresponding electromagnetic elements attracted to each other, and one of the light emitting diodes leaves a temporarily substrate.

In an embodiment of the present disclosure, a current direction of the second current path is changed, so as to make one of the pickup heads and one of the electromagnetic elements repel each other, and one of the light emitting diodes approaches the active array substrate when one of the pickup heads is going to place one of the attracted light emitting diodes on the active array substrate.

In an embodiment of the present disclosure, when one of the pickup heads is going to place one of the attracted light emitting diodes on the active array substrate, the control element stops providing the signal to one of the first conductive channels and one of the fourth conductive channels, and one of the light emitting diodes leaves one of the pickup heads.

In an embodiment of the present disclosure, the conductive via structures include a plurality of first conductive via structures and a plurality of second conductive via structures. Each of the pickup heads includes a first portion, a second portion, at least one first insulator, a second insulator and a conductive element. The first portion is disposed adjacent to the substrate and located between the substrate and the second portion. The at least one first insulator is disposed between the first portion and the second portion, wherein the first portion, the second portion and the at least one first insulator define a buffer region. The second insulator is disposed on the second portion. The conductive element passes through the first portion, the at least one first insulator and the second portion and disposed between the second portion and the second insulator, wherein two ends of the conductive element are electrically connected to one of the first conductive channels and one of the second conductive channels, respectively. One of the first conductive via structures, the conductive element of one of the pickup heads, and one of the second conductive via structures form a current path, when one of the pickup heads is going to attract one of the light emitting diodes, one of the pickup heads is induced charge for attracting the corresponding light emitting diodes and the corresponding light emitting diodes leaves a temporarily substrate.

In an embodiment of the present disclosure, when one of the pickup heads attracts one of the light emitting diodes, the second portion are elastically deformed and partly in the buffer region.

In an embodiment of the present disclosure, a current direction of the current path is changed after one of the pickup heads placing one of the attracted light emitting diodes on the active array substrate.

In an embodiment of the present disclosure, the control element provides the signal to change the current direction of the current path.

Based on the above, because the conductive via structures of the substrate of the present disclosure are electrically connected between the control element and the pickup structure, each of the pickup heads can be controlled independently. And, each of the pickup heads can independently pickup or place each light emitting diodes. In comparison with the current manner of totally picking up the all of the light emitting diodes on the wafer or loading substrate, the pickup and placing device of the present disclosure can selectively pickup or place the selected light emitting diodes, and the selected light emitting diodes can have the same or similar optical properties.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
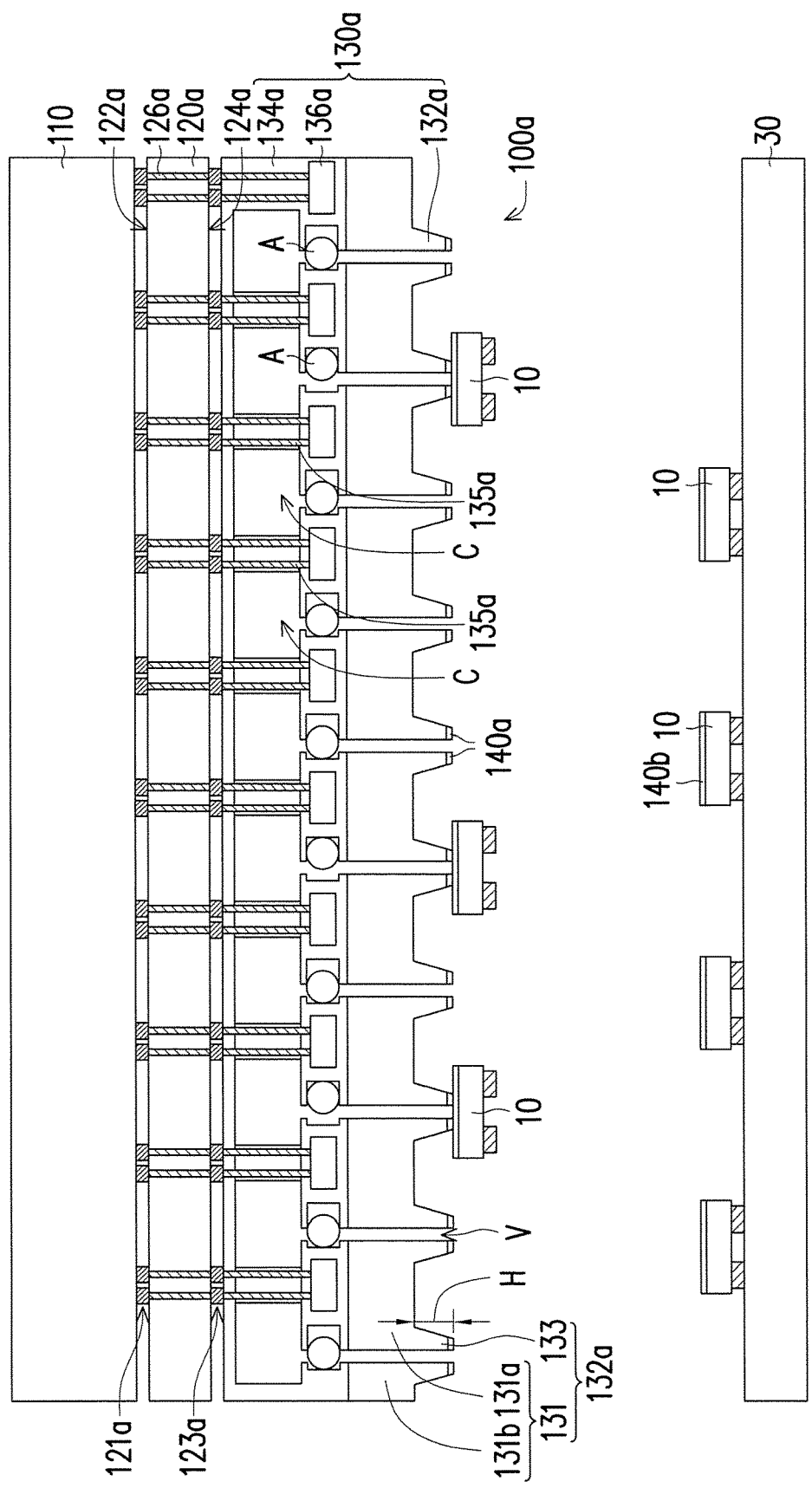
FIG. 1 is a schematic view of a pickup and placing device and an active array substrate of an embodiment of the present disclosure.

FIG. 1 is a schematic view of a pickup and placing device and an active array substrate of an embodiment of the present disclosure. FIG. 2A to FIG. 2G are schematic cross-sectional views of the manufacturing method of the pickup head of FIG. 1. Please referring to FIG. 1, in the embodiment, the pickup and placing device 100a includes a control element 110, a substrate 120a and a pickup structure 130a. The substrate 120a has an upper surface 122a and a lower surface 124a opposite to each other and a plurality of conductive via structures 126a, wherein the conductive via structures 126a are electrically connected to the control element 110. The pickup structure 130a includes a plurality of pickup heads 132a used for picking up or placing a plurality of light emitting diodes 10 respectively. The pickup structure 130a is disposed on the lower surface 124a of the substrate 120a or disposed in the substrate 120a and extended outside the substrate 120a, wherein the pickup structure 130a is electrically connected to the conductive via structures 126a.

In detail, the control element 110 of the embodiment can be a circuit board produced by CMOS manufacturing process, for example, but the disclosure is not limited thereto. In the embodiment, the substrate 120a is substantially a silicon substrate, ceramic substrate or germanium substrate, and the conductive via structures 126a is substantially the conductive strips or lumps located in the plurality of through holes in the substrate 120a, but the disclosure is not limited thereto. As illustrated in FIG. 1, the substrate 120a includes a plurality of first pads 121a and a plurality of second pads 123a, wherein the first pads 121a are located on the upper surface 122a of the substrate 120a, and the second pads 123a are located on the lower surface 124a of the substrate 120a. The conductive via structures 126a penetrate the substrate 120a and are connected to the first pads 121a and the second pads 123a respectively. That is, one end of each of the conductive via structures 126a is connected to the first pad 121a, and the other end of each of the conductive via structures 126a is connect to the second pad 123a. Besides, each of the conductive via structures 126a can receive the control signal transmitted by the control element 110 independently.

Figure 2A:
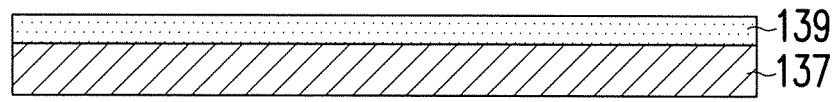
FIG. 2A to FIG. 2G are schematic cross-sectional views of the manufacturing method of the pickup head of FIG. 1.
Figure 2B:
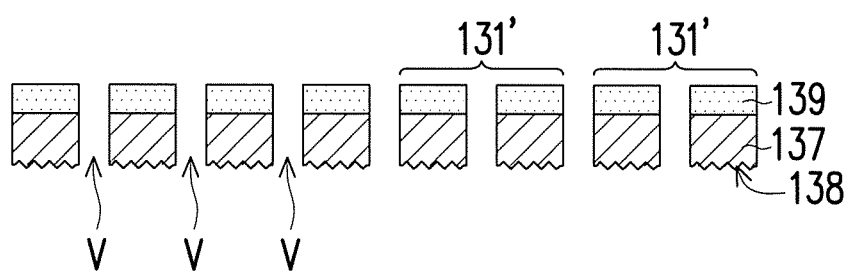
Figure 2C:
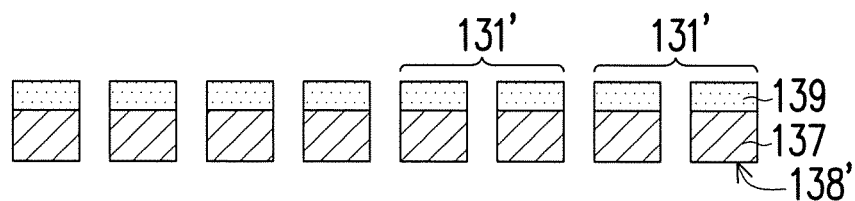
Figure 2D:
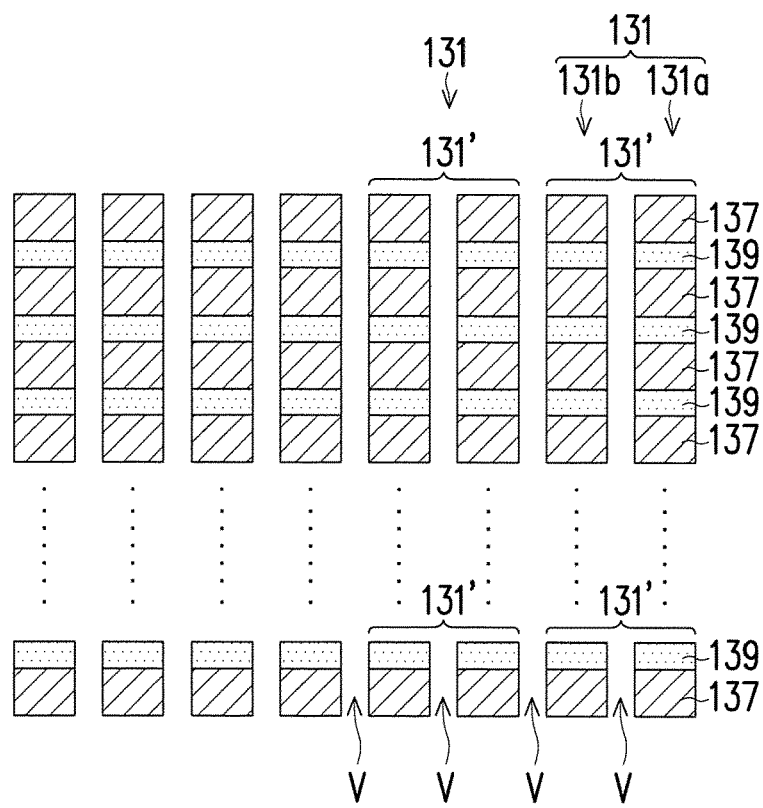
Figure 2E:
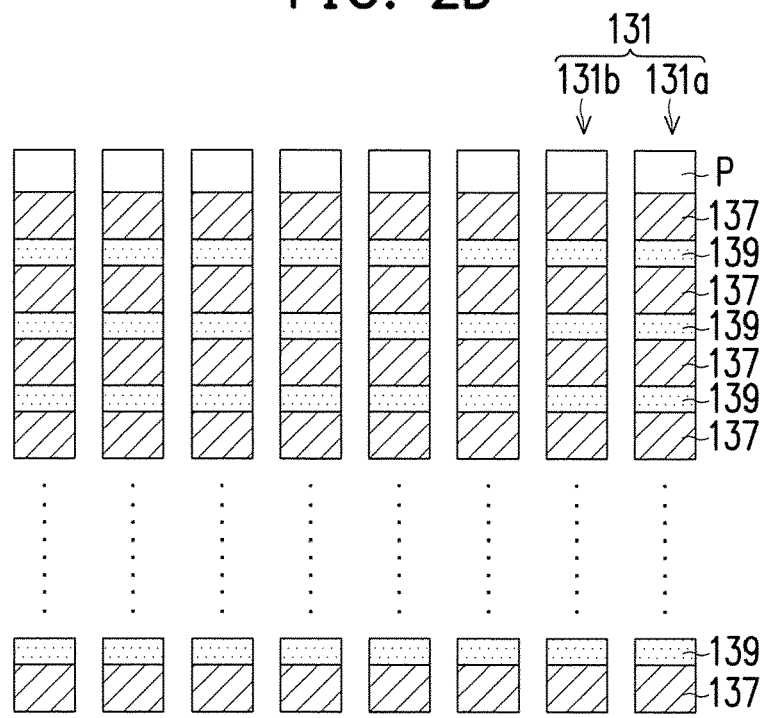
Figure 2F:
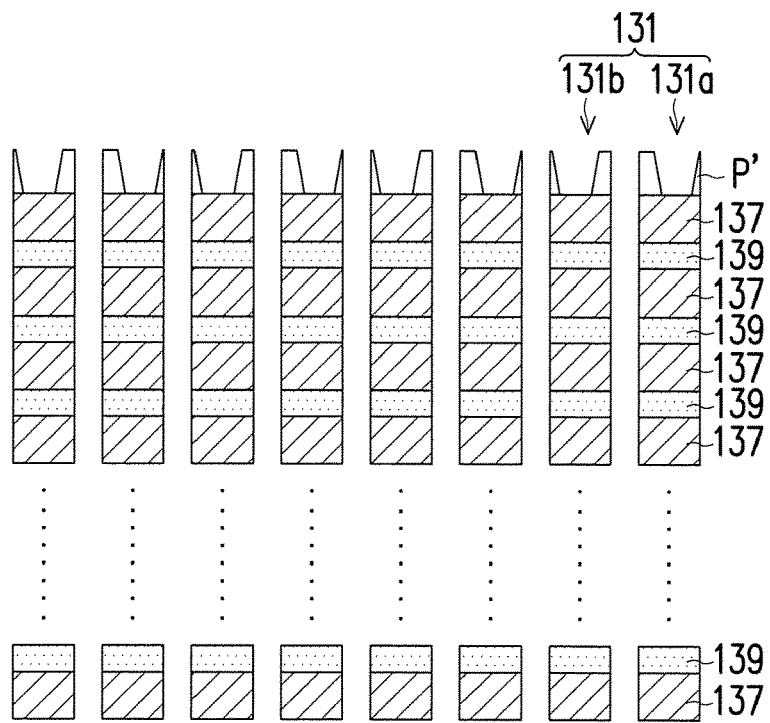
Figure 2G:
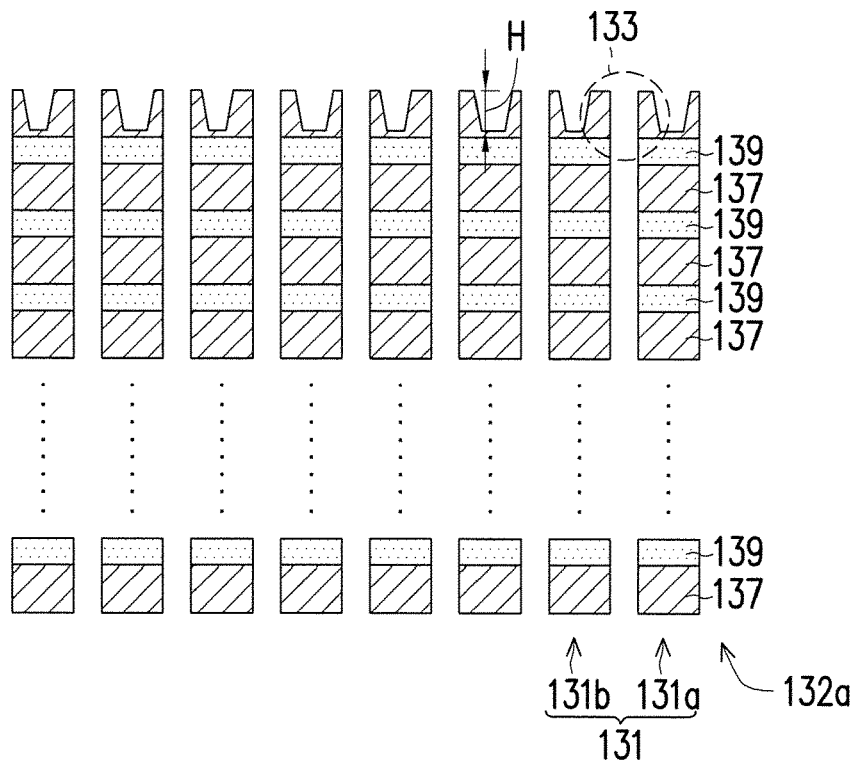

Please referring to FIG. 1 and FIG. 2G simultaneously, the pickup structure 130a in the embodiment is substantially disposed on the lower surface 124a of the substrate 120a, and each of the pickup heads 132a includes a main body portion 131 and a pickup portion 133. The main body portion 131 includes a first body portion 131a and a second body portion 131b, wherein a channel V is provided between the first body portion 131a and the second body portion 131b. The pickup portion 133 is disposed on the first body portion 131a and the second body portion 131b of the main body portion 131 and exposes the channel V, wherein a diameter of the pickup portion 133 gradually decreases from the main body portion 131 in a direction away from the main body portion 131, and a height H1 of the pickup portion 133 is between 1 micrometer and 50 micrometers, for example, but the disclosure is not limited thereto. Herein, the main body portion 131 is composed by stacking a plurality of metal layers 137 with at least one bonding layer 139 alternately. But in other embodiments (not shown), the main body portion can be form by a single metal layer.

In addition, please referring to FIG. 1 again, the pickup structure 130a of the embodiment further includes a carrier 134a and a plurality of controllers 136a. The carrier 134a includes a plurality of chambers C and a plurality of conductive elements 135a, wherein the channel V is connected to the chamber C. The controllers 136a are disposed in the carrier 134a, and electrically connected to the conductive via structures 126a of the substrate 120a through the conductive elements 135a respectively for switching the chamber C between the opening state and the closing state respectively. Therefore, when the control element 110 transmit the signal to the controllers 136a through the conductive via structures 126a and the conductive elements 135a, the opening state and closing state of each of the chambers C can be controlled independently, and the pickup heads 132a can attract the light emitting diodes 10 from the wafer (not shown) or the temporary substrate (not shown) through vacuum suction. Or, the pickup heads 132a can place the light emitting diodes 10 on the target location, such as the active array substrate 30, circuit board (not shown), or another supporting substrate (not shown) through stopping the vacuum.

Because the conductive via structures 126a of the substrate 120a of the embodiment are electrically connected between the control element 110 and the pickup heads 132a, each of the pickup heads 132a can be controlled independently and pickup or place each light emitting diodes 10 independently. Besides, the interior space for disposing the conductive wires of the pickup and placing device 100a can be reduced, so the effect of microminiaturization is provided. In comparison with the current manner of totally picking up all of the light emitting diodes on wafer or the supporting substrate, the pickup and placing device 100a of the embodiment can selectively pickup or place the selected light emitting diodes 10, and the selected light emitting diodes 10 can have the same or similar optical properties. In the embodiment of present disclosure, the light emitting diodes 10 can be micro light emitting diodes, but the disclosure is not limited thereto.

About the manufacturing method, please referring to FIG. 1 again, the manufacturing method of the pickup and placing device 100a includes the following steps. First, the control element 110 is provided, wherein the control element 110 can be a circuit board produced by CMOS manufacturing process, for example, but the disclosure is not limited thereto. Then, the substrate 120a is provided and disposed on the control element 110, wherein the substrate 120a has an upper surface 122a and a lower surface 124a opposite to each other and a plurality of conductive via structures 126a, and the conductive via structures 126a are electrically connected to the control element 110. Herein, the substrate 120a is substantially a silicon substrate, and the conductive via structures 126 are substantially a plurality of silicon vias structures, but the disclosure is not limited thereto. The silicon via structures penetrate the silicon substrate and the conductive material is disposed in the silicon via structures. As illustrated in FIG. 1, the substrate 120a includes the first pads 121a and the second pads 123a, wherein the first pads 121a are located on the upper surface 122a of the substrate 120a, the second pads 123a are located on the lower surface 124a of the substrate 120a, and the conductive via structures 126a penetrate the substrate 120a and are connected to the first pads 121a and the second pads 123a respectively. After that, the pickup structure 130a is provided and disposed on the substrate 120a, wherein the pickup structure 130a includes the pickup heads 132a used for picking up or placing the light emitting diodes 10 respectively. The pickup structure 130a is disposed on the lower surface 124a of the substrate 120a, and the substrate 120a is disposed between the control element 110 and the pickup structure 130a, wherein the pickup structure 130a is electrically connected to the conductive via structures 126a.

Please referring to FIG. 2A, the manufacturing method of the pickup heads 132a of the embodiment includes the following steps. First, the metal layer 137 and the bonding layer 139 located on the metal layer 137 are provided, wherein the metal layer 137 is Au (Aurum) layer, Al (Aluminum) layer, Cu (Cuprum/Copper) layer or alloy of the above materials, for example, but the disclosure is not limited thereto. Beside, the thickness of the metal layer 137 is preferably between 50 micrometers and 200 micrometers, and the material of the bonding layer 139 is polymer, metallic polymer or metallic alloy, for example, but the disclosure is not limited thereto.

Then, please referring to FIG. 2B, a hole drilling process is performed on the metal layer 137 and the bonding layer 139, and then a plurality of channel V are formed, and a plurality of initial main body portion 131' are defined. Here, the hole drilling process can be accomplished by a laser drilling process, electric arc, or etching process, but the disclosure is not limited thereto. The hole diameter of the channel V is between 1 micrometer and 10 micrometers, for example, but the disclosure is not limited thereto.

Then, please referring to FIG. 2B and FIG. 2C simultaneously. If the channel V is formed by a laser drilling or electric arc process, then a rough lower surface 138 is formed on the metal layer 137. Therefore, the rough lower surface 138 can be selectively polished and transform into a smooth lower surface 138', so as to favor the follow-up manufacturing method.

Then, please referring to FIG. 2D, when the metal layer 137 is substantially between 50 micrometers and 200 micrometers, because the thickness of the initial main body portion 131' defined by the mono-layer metal layer 137 and the mono-layer bonding layer 139 is not sufficient, the structural strength of the later-forming pickup heads are poor, and the light emitting diode 10 can not be effectively picked up or placed. Therefore, the step for providing the metal layer 137 and the bonding layer 139 disposed on the metal layer 137 and the step for forming the channel V can be repeated sequentially, that is, the steps illustrated by FIG. 2A to FIG. 2C are repeated, to defined the plurality of main body portions 131. Here, the main body portion 131 includes a first body portion 131a and a second body portion 131b, and a height H2 of the main body portion 131 is preferably between 1 millimeter and 2 millimeters, but the disclosure is not limited thereto.

Then, please referring to FIG. 2E, the photoresist layer P is formed on the first body portion 131a and the second body portion 131b of each of the bodies 131, wherein the photoresist layer P is positive photoresist, for example, but the disclosure is not limited thereto. Then, please referring to FIG. 2F, a pattern process is performed on the photoresist layer P, and a patterned photoresist layer P is formed, wherein the patterned photoresist layer P exposes the channel V. Last, please referring to FIG. 2G, a etching process, such as a dry etching process, but the disclosure is not limit thereto, is performed on the main body portions 131 using the patterned photoresist layer P' as the mask, so a plurality of pickup portions 133 are formed on the first body portions 131a and the second body portions 131b, wherein the pickup portions 133 and the main body portions 131 define the pickup heads 132a. Preferably, the diameter of each of the pickup portions 133 gradually decreases from the corresponding main body portion 131 in a direction away from the corresponding main body portion 131. Here, a height H1 of each of the pickup portions 133 is between 1 micrometer and 50 micrometers. Accordingly, the manufacturing of the pickup head 132a of the pickup structure 130a is completed.

What needs to be noted is that in the embodiment, the buffer layers 140a, 140b can be disposed on the surface of the pickup head 132a and/or the surface of the light emitting diode 10 respectively, and the impact force produced by the collision between the pickup head 132a and the light emitting diode 10 can be effectively reduced. The buffer layers 140a, 140b can be formed on the surfaces of the pickup head 132a and/or the light emitting diode 10 by 3D print, ink jet print, micro-contact print and so on, but the disclosure is not limited thereto. The material of the buffer layers 140a, 140b can be polymer materials such as epoxy, silicone, acrylic copolymer or styrene copolymer, but the disclosure is not limited thereto.

Then, please referring to FIG. 1 again, after the formation of the pickup heads 132a, the carrier 134a is provided, wherein the carrier 134a includes the chambers C and a plurality of conductive elements 135a, and the chambers C are connected to the channel V of the pickup head 132a respectively. Then, the controllers 136a are provided, disposed in the carrier 134a, and electrically connected to the conductive via structures 126a of the substrate 120a through the conductive elements 135a respectively for switching the chamber C between the opening state and the closing state respectively. So far, the manufacturing of the pickup structure 130a is completed.

About the operation, please referring to FIG. 1 again, the control element 110 provides a signal, and the signal is transmitted to the pickup heads 132a through the conductive via structures 126a. The pickup heads 132a can attract the selected light emitting diodes 10 or place the attracted light emitting diodes 10 on the active array substrate 30. More specifically, the pickup structure 130a of the embodiment further includes a plurality of valves A disposed in the chambers C respectively. When the pickup head 132a is going to attract the corresponding light emitting diode 10, the controller 136a receives the signal from the control element 110 to control the valve A, and then the chamber C and the corresponding channel V are connected to each other for attracting the corresponding light emitting diode 10. The controller 136a makes the valve A isolate the chamber C and the corresponding channel V, and the light emitting diode 10 is placed on the active array substrate 30 when the pickup head 132a is going to place the attracted light emitting diode 10 on the active array substrate 30.

It should be noted that the reference numerals and a part of the contents in the previous embodiment are used in the following embodiments, in which identical reference numerals indicate identical or similar components, and repeated description of the same technical contents is omitted. Please refer to the descriptions of the previous embodiment for the omitted contents, which will not be repeated hereinafter.

Figure 3:
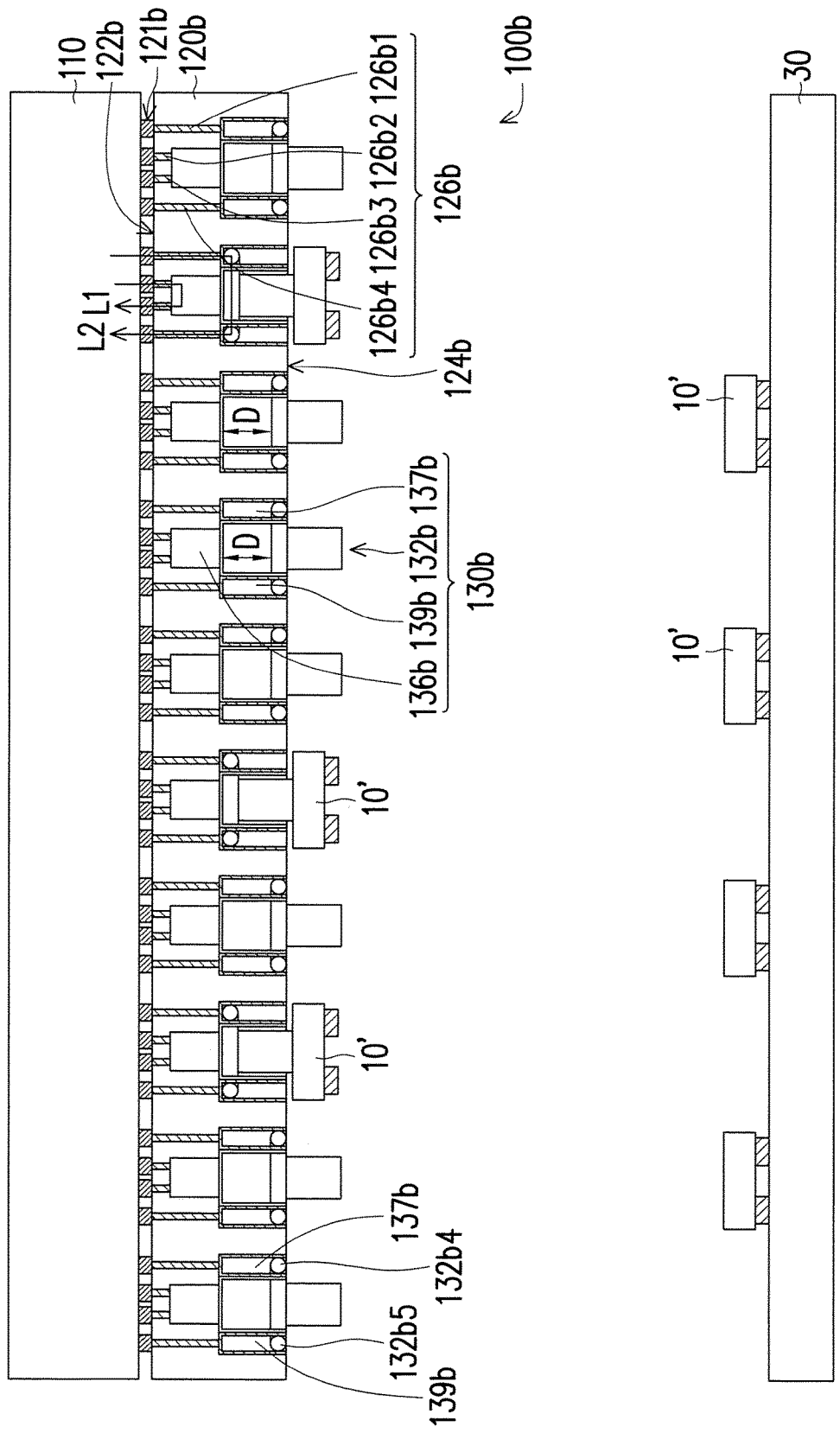
FIG. 3 is a schematic view of a pickup and placing device and an active array substrate of an embodiment of the present disclosure.

FIG. 3 is a schematic view of a pickup and placing device and an active array substrate of an embodiment of the present disclosure. FIG. 4A to FIG. 4F are schematic cross-sectional views of the manufacturing method of the pickup head of FIG. 3. Please referring to FIG. 3 first, the pickup and placing device 100b of the embodiment is similar to the pickup and placing device 100a of FIG. 1. The main difference between them lies in that the substrate 120b of the embodiment includes a plurality of first pads 121b disposed on the upper surface 122b, and the conductive via structures 126b are electrically connected to the first pads 121b respectively. More specifically, the conductive via structures 126b of the embodiment include a plurality of first conductive via structures 126b1, a plurality of second conductive via structures 126b2, a plurality of third conductive via structures 126b3, and a plurality of fourth conductive via structures 126b4.

Moreover, the pickup structures 130b of the embodiment are integrated in the substrate 120b, and the pickup heads 132b can be movably disposed in the substrate 120b and extended outside the substrate 120b, wherein the pickup structure 130b further includes a plurality of electromagnetic elements 136b, a plurality of first conductive channels 137b, and a plurality of second conductive channels 139b. The electromagnetic elements 136b are disposed in the substrate 120b and electrically connected to the second conductive via structures 126b2 and the third conductive via structures 126b3 respectively, wherein each of the electromagnetic elements 136b includes coil. The material of the coil is electromagnetic material. Or, the electromagnetic material can be filled in the coil. The first conductive channels 137b are extended from the lower surface 124b to the upper surface 122b of the substrate 120b and connected to the first conductive via structures 126b1. The second conductive channels 139b are extended from the lower surface 124b to the upper surface 122b of the substrate 120b and connected to the fourth conductive via structures 126b4. Here, the pickup heads 132b are electromagnetic materials able to become magnetic through application of an electric current, and the light emitting diodes 10' contain magnetic material such as Fe, Co, Ni or combination thereof, but the disclosure is not limited thereto. The pickup heads 132b are disposed in correspondence to the electromagnetic elements 136b respectively, and movably disposed in the substrate 120b and extended outside the substrate 120b. A distance D is provided between each of the electromagnetic element 136b and each of the pickup head 132a, and the pickup heads 132b are electrically connected to the first conductive channels 137b and the second conductive channels 139b respectively.

Figure 4A:
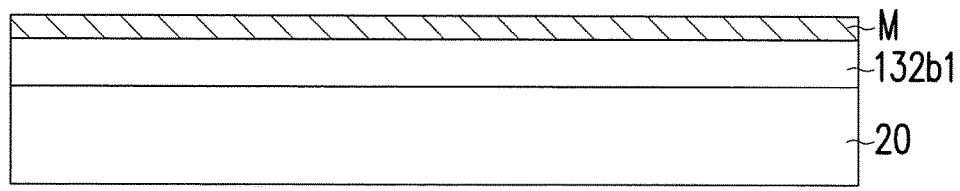
FIG. 4A to FIG. 4F are schematic cross-sectional views of the manufacturing method of the pickup head of FIG. 3.
Figure 4B:
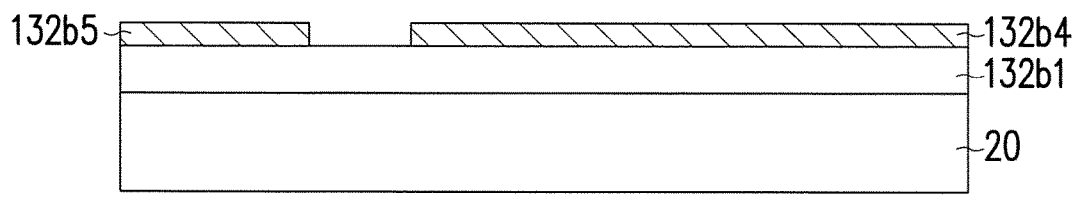
Figure 4C:
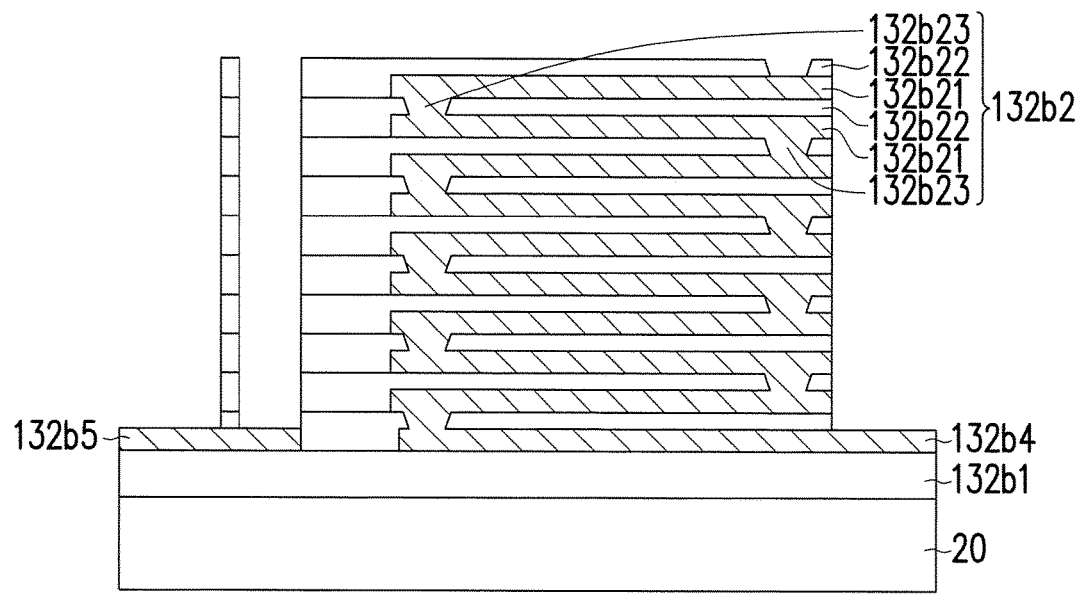
Figure 4D:
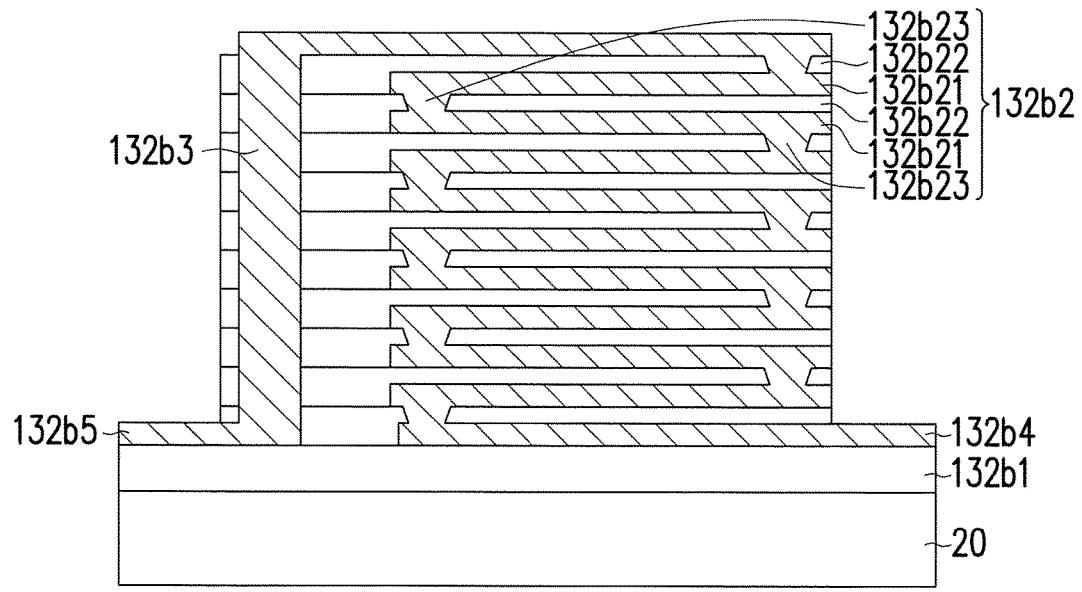
Figure 4E:
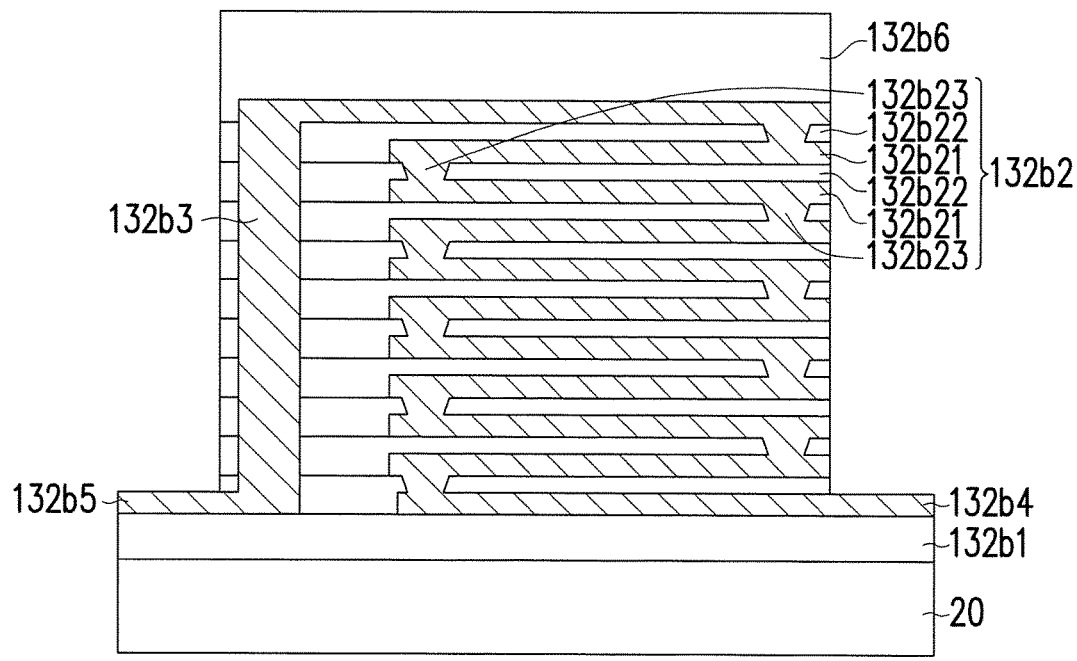
Figure 4F:
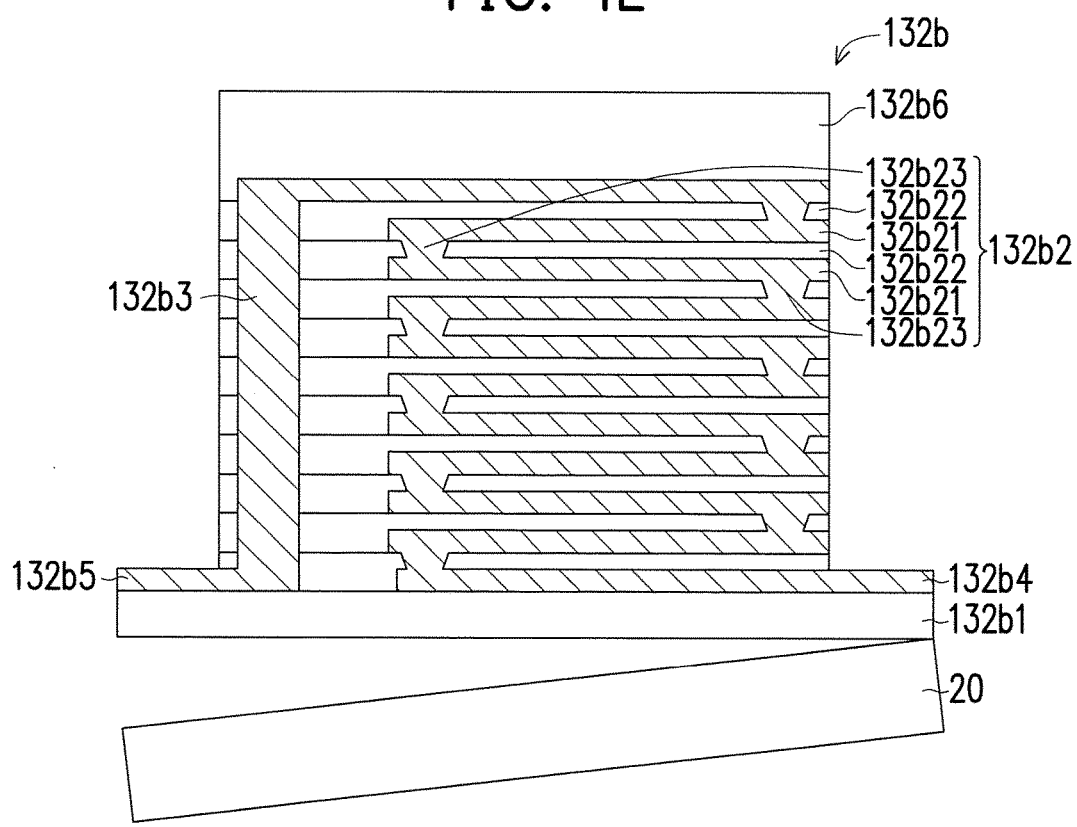

In addition, please referring to FIG. 3 and FIG. 4F simultaneously, in the embodiment, each of the pickup heads 132b includes a carrier board 132b1, stacked structure layers 132b2, conductive through via 132b3, a first conductive element 132b4, a second conductive element 132b5, and a covering layer 132b6. The first conductive element 132b4 and the second conductive element 132b5 are electrically connected to the inside of the first conductive channel 137b and the second conductive channel 139b respectively. The stacked structure layer 132b2 includes a plurality of metal layers 132b21, a plurality of protection layers 132b22, and a plurality of conduction vias 132b23, wherein the metal layers 132b21 and the protection layers 132b22 are stacked sequentially and alternately on the first conductive element 132b4, and the conduction vias 132b23 are electrically connected between the metal layers 132b21 and between the metal layer 132b21 located most adjacently to the carrier board 132b1 and the first conductive element 132b4. The conductive through via 132b3 penetrates the protection layers 132b22, extendedly disposed on the furthest protection layer 132b22 of the carrier board 132b1, and electrically connected to the second conductive element 132b5. The covering layer 132b6 overs the conductive through via 132b3.

When the control element 110 transmits the signals to the electromagnetic elements 136b and the first conductive element 132b4 and the second conductive element 132b5 of the pickup heads 132b through the conductive via structures 126b, a magnetic force is produced between the electromagnetic element 136b and the pickup head 132b having the coil by application of an electric current, and then the pickup head 132b can move toward the electromagnetic element 136b. That is, the distance D is deceased and the magnetic light emitting diode 10' is attracted from the wafer (not shown) or temporary substrate (not shown).

Because the conductive via structures 126b of the substrate 120b of the embodiment are electrically connected between the control element 110 and the pickup structures 130b, the pickup structures 130b can make each of the pickup heads 132a able to independently pickup or place each light emitting diode 10' through the magnetic force produced by application of the electric current. In comparison with the current manner of totally picking up all of the light emitting diodes on the wafer or the temporary substrate, the pickup and placing device 100b of the embodiment can selectively pickup or place the selected light emitting diodes 10', and the selected light emitting diodes 10' can have the same or similar optical properties. In addition, the distance between the pickup heads 132b and the distance between the pixels on the active array substrate are substantially the same or in an integral multiple relationship.

About the manufacturing method of the pickup heads 132b, please referring to FIG. 4A. First, a support substrate 20 is provided, wherein the support substrate 20 is glass substrate, silicon substrate, or germanium substrate, for example, but the disclosure is not limited thereto. Then, a carrier board 132b1 and a metallic material layer M located on the carrier board 132b1 are provided on the support substrate 20, wherein the carrier board 132b1 is disposed on the support substrate 20 and between the metallic material layer M and the support substrate 20.

Then, please referring to FIG. 4B, the first conductive element 132b4 and the second conductive element 132b5 are formed on the carrier board 132b1 by applying photoresist coating, exposure, developing and etching to the metallic material layer M, wherein the first conductive element 132b4 and the second conductive element 132b5 are electrically isolated. Here, the material of the first conductive element 132*b*4 and the second conductive element 132*b*5 is metal such as Au, Ag, Cu, Al, for example, but the disclosure is not limited thereto, or other metallic compounds.

Then, please referring to FIG. 4C, the stacked structure layers 132*b*2 are disposed on the carrier board 132*b*1, wherein the stacked structure layer 132*b*2 includes a plurality of metal layers 132*b*21, a plurality of protection layers 132*b*22, and a plurality of conduction vias 132*b*23, the metal layers 132*b*21 and the protection layers 132*b*22 are stacked sequentially and alternately on the first conductive element 132*b*4, and the conduction vias 132*b*23 are electrically connected between the metal layers 132*b*21 and between the metal layer 132*b*21 located most adjacently to the carrier board 132*b*1 and the first conductive element 132*b*4.

Then, please referring to FIG. 4D, the conductive through via 132*b*3 is formed to penetrate the protection layers 132*b*22. Then, please referring to FIG. 4E, the covering layer 132*b*6 is formed to cover the conductive through via 132*b*3, wherein the material of the covering layer 132*b*6 can be the same with or different from the material of the protection layers 132*b*22. Finally, please referring to FIG. 4F, the support substrate 20 is removed for exposing the carrier board 132*b*1, and the manufacturing of the pickup head 132*b* is completed.

About the operation, please referring to FIG. 3 again, when the pickup head 132*b* is going to attract the corresponding light emitting diode 10', the first conductive via 126*b*1, the pickup head 132*b*, and the fourth conductive via 126*b*4 form a second current path L2, and then the pickup head 132*b* is magnetic for attracting the light emitting diodes 10'. The second conductive via 126*b*2, the electromagnetic element 136*b*, and the third conductive via 126*b*3 form a first current path L1 making the pickup head 132*b* and the electromagnetic element 136*b* attracted to each other, and then the light emitting diode 10' leaves the temporarily substrate (that is, leaving the place where the light emitting diode 10' originally located). When the pickup head 132*b* is going to place the attracted light emitting diode 10' on the active array substrate 30, the current direction of the first current path L1 is changed, so as to make the pickup head 132*b* and the electromagnetic element 136*b* repel each other, and then the light emitting diode 10' approaches the active array substrate 30. When the pickup head 132*b* is going to place the attracted light emitting diode 10' on the active array substrate 30, the control element 110 stop providing the signal to the first conductive via 126*b*1 and the fourth conductive via 126*b*4, and then the light emitting diode 10' leaves the pickup head 132*b*. In another embodiment, the signal can be provided by the control element 110, and the current direction of the second current path L2 is reversed with respect to the current direction of the original pickup operation. So, a repulsive force is provided to the light emitting diode 10' and makes the light emitting diode 10' leave the pickup head 132*b*.

Figure 5:
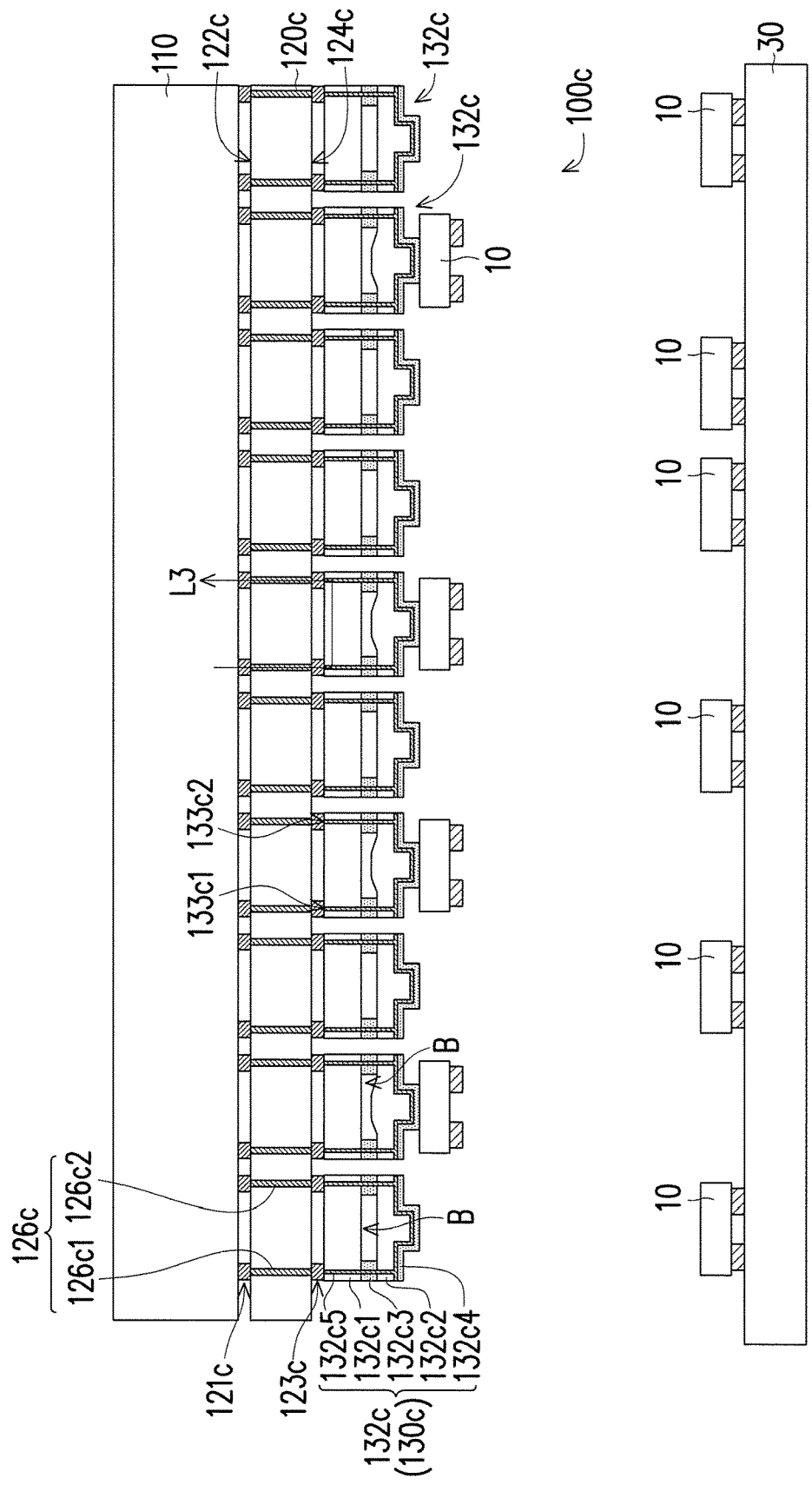
FIG. 5 is a schematic view of a pickup and placing device and an active array substrate of an embodiment of the present disclosure.

FIG. 5 is a schematic view of a pickup and placing device and an active array substrate of an embodiment of the present disclosure. Please referring to FIG. 5, the pickup and placing device 100*c* of the embodiment is similar to the pickup and placing device 100*a* of FIG. 1. The main difference between them lies in that the conductive via structures 126*c* of the substrate 120*c* are electrically connected to the first pads 121*c* and the second pads 123*c* located on the upper surface 122*c* and the lower surface 124*c*, respectively. The conductive via structures 126*c* include a plurality of first conductive via structures 126*c*1 and a plurality of second conductive via structures 126*c*2, wherein the first conductive via structures 126*c*1 and the second conductive via structures 126*c*2 are arranged alternately. Each of the pickup heads 132*c* of the pickup structures 130*c* includes a first portion 132*c*1, a second portion 132*c*2, at least one first insulator 132*c*3, a second insulator 132*c*4 and a conductive element 132*c*5. The first portion 132*c*1 is disposed adjacent to the substrate 120*c* and located between the substrate 120*c* and the second portion 132*c*2. The at least one first insulator 132*c*3 is disposed between the first portion 132*c*1 and the second portion 132*c*2, wherein the first portion 132*c*1, the second portion 132*c*2 and the at least one first insulator 132*c*3 define a buffer region B. The second insulator 132*c*4 is disposed on the second portion 132*c*2. The conductive element 132*c*5 passes through the first portion 132*c*1, the at least one first insulator 132*c*3 and the second portion 132*c*2 and partially disposed between the second portion 132*c*2 and the second insulator 132*c*4, wherein two ends 133*c*1, 133*c*2 of the conductive element 132*c*5 are electrically connected to one of the first conductive channels 126*c*1 and one of the second conductive channels 126*c*2, respectively. And, one of the first conductive via structures 126*c*1, the conductive element 132*c*5 of one of the pickup heads 132*c*, and one of the second conductive via structures 126*c*2 form a current path L3.

In detail, each of the pickup heads 132*c* of the pickup structures 130*c* of the embodiment can be an electrostatic head. The first portion 132*c*1, the second portion 132*c*2, the at least one first insulator 132*c*3 and the second insulator 132*c*4 of each of the pickup heads 132*c* are flexible and can be deformed by external forces. The buffer region B defined by the first portion 132*c*1, the second portion 132*c*2 and the at least one first insulator 132*c*3 can accommodate the second portion 132*c*2 after deformation.

About the operation, please referring to FIG. 5 again, when one of the pickup head 132*c* is going to attract the corresponding light emitting diode 10, the control element 110 provides the signal through current path L3 to induce the charge between the second portion 132*c*2 and the second insulator 132*c*3. At this time, for example, but not limited thereto, when the signal is a direct current, a plurality of positive (or negative) charges are accumulated between the second portion 132*c*2 and the second insulator 132*c*4, and the corresponding light emitting diode 10 has a plurality of negative (or positive) charge. When the signal is an alternating current, the charge between the second portion 132*c*2 and the second insulator 132*c*4 is variety with time. And so on the corresponding light emitting diode 10. And then, one of the pickup heads 132*c* is induced charge. The second portion 132*c*2 is elastically deformed and partly in the buffer region B. That is an example, but not limited to, in some embodiments the second portion 132*c*2 is not deformed. After one of the pickup heads 132*c* placing one of the attracted light emitting diodes 10 on the active array substrate 30, the control element 110 provides the signal to change the current direction of the current path L3 to reduce the remain charge between second portion 132*c*2 and the corresponding light emitting diodes 10 (this is a example for DC signal, in AC signal we can cancel this step), after that the control element 110 provides the signal to stop the current and makes the light emitting diode 10 leave the pickup head 132*c*.

Based on the above, because the conductive structure of the substrate of the present disclosure is electrically connected between the control element and the pickup structure, the picking up or placing operation of each of the pickup heads can be controlled independently. So, the pickup and placing device of present disclosure can selectively pick up or place the selected light emitting diodes, and the selected light emitting diodes have the same or similar optical properties.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An operation method of picking and placing by a pickup and placing device, comprising:
   providing a pickup and placing device comprising:
   a control element;
   a substrate; and
   a pickup structure comprising a plurality of pickup heads used for picking up or placing a plurality of light emitting diodes respectively, wherein the substrate has an upper surface and a lower surface opposite to each other and a plurality of conductive via structures, the conductive via structures are electrically connected to the control element, the pickup structure is electrically connected to the conductive via structures, the control element provides a signal, and the signal is transmitted to the pickup structure through the conductive via structures and selects a portion of the pickup heads, and the portion of the pickup heads of the pickup structure attract the selected light emitting diodes or place the attracted light emitting diodes on an active array substrate;
   wherein each of the pickup heads comprises a main body portion and a pickup portion, the main body portion comprises a first body portion and a second body portion, a channel is provided between the first body portion and the second body portion, the pickup portion is disposed on the first body portion and second body portion of the main body portion and the pickup portion exposes the channel, the pickup structure further comprises a carrier, a plurality of controllers and a plurality of valves, the carrier comprises a plurality of chambers and a plurality of conductive elements, the plurality of channels are connected to the corresponding chambers, the controllers are disposed in the carrier and connected to the conductive via structures of the substrate through the conductive elements respectively, the valves are disposed in the chambers respectively, when one of the pickup heads is going to attract one of the corresponding light emitting diodes, one of the controllers controls one of the corresponding valves, and one of the chambers and one of the corresponding channels are connected to each other for attracting one of the corresponding light emitting diodes.

2. The operation method of picking and placing by the pickup and placing device as recited in claim 1, wherein one of the controllers makes one of the valves isolate one of the chambers and one of the corresponding channels, and one of the light emitting diodes is placed on the active array substrate when one of the pickup heads is going to place one of the attracted light emitting diodes on the active array substrate.

3. An operation method of picking and placing by a pickup and placing device, comprising:
   providing a pickup and placing device comprising:
   a control element;
   a substrate; and
   a pickup structure comprising a plurality of pickup heads used for picking up or placing a plurality of light emitting diodes respectively, wherein the substrate has an upper surface and a lower surface opposite to each other and a plurality of conductive via structures, the conductive via structures are electrically connected to the control element, the pickup structure is electrically connected to the conductive via structures, the control element provides a signal, and the signal is transmitted to the pickup structure through the conductive via structures and selects a portion of the pickup heads, and the portion of the pickup heads of the pickup structure attract the selected light emitting diodes or place the attracted light emitting diodes on an active array substrate; wherein the conductive via structures comprise a plurality of first conductive via structures, a plurality of second conductive via structures, a plurality of third conductive via structures, and a plurality of fourth conductive via structures, and the pickup structure further comprises:
   a plurality of electromagnetic elements disposed in the substrate and electrically connected to the second conductive via structures and the third conductive via structures respectively;
   a plurality of first conductive channels extended from the lower surface to the upper surface of the substrate and connected to the first conductive via structures respectively; and
   a plurality of second conductive channels extended from the lower surface to the upper surface of the substrate and connected to the fourth conductive via structures respectively,
   wherein the pickup heads are disposed in correspondence to the electromagnetic elements respectively, and disposed in the substrate and extended outside the substrate, a distance is provided between at least one of the electromagnetic elements and at least one of the corresponding pickup heads, and at least one of the pickup heads is electrically connected to one of the first conductive channels and one of the second conductive channels;
   and when one of the pickup heads is going to attract one of the light emitting diodes, one of the first conductive via structures, one of the pickup heads, and one of the fourth conductive via structures form a first current path, and one of the pickup heads is magnetic for attracting one of the light emitting diodes.

4. The operation method of picking and placing by the pickup and placing device as recited in claim 3, wherein one of the second conductive via structures, one of the electromagnetic elements, and one of the third conductive via structures form a second current path making one of the pickup heads and one of the corresponding electromagnetic elements attracted to each other, and one of the light emitting diodes leaves a temporarily substrate.

5. The operation method of picking and placing by the pickup and placing device as recited in claim 4, wherein a current direction of the second current path is changed, so as to make one of the pickup heads and one of the corresponding electromagnetic elements repel each other, and one of the light emitting diodes approaches the active array substrate when one of the pickup heads is going to place one of the attracted light emitting diodes on the active array substrate.

6. The operation method of picking and placing by the pickup and placing device as recited in claim 5, wherein the control element stops providing the signal to one of the first conductive via structures and one of the fourth conductive via structures, and one of the light emitting diodes leaves one of the pickup heads when one of the pickup heads is going to place one of the light emitting diodes on the active array substrate.

7. An operation method of picking and placing by a pickup and placing device, comprising:
providing a pickup and placing device comprising:
a control element;
a substrate; and
a pickup structure comprising a plurality of pickup heads used for picking up or placing a plurality of light emitting diodes respectively, wherein the substrate has an upper surface and a lower surface opposite to each other and a plurality of conductive via structures, the conductive via structures are electrically connected to the control element, the pickup structure is electrically connected to the conductive via structures, the control element provides a signal, and the signal is transmitted to the pickup structure through the conductive via structures and selects a portion of the pickup heads, and the portion of the pickup heads of the pickup structure attract the selected light emitting diodes or place the attracted light emitting diodes on an active array substrate; wherein the conductive via structures comprise a plurality of first conductive via structures and a plurality of second conductive via structures, and each of the pickup heads comprises:
a first portion disposed adjacent to the substrate;
a second portion, the first portion located between the substrate and the second portion;
at least one first insulator, disposed between the first portion and the second portion, wherein the first portion, the second portion and the at least one first insulator define a buffer region;
a second insulator, disposed on the second portion; and
a conductive element, passing through the first portion, the at least one first insulator and the second portion and disposed between the second portion and the second insulator, wherein two ends of the conductive element are electrically connected to one of the first conductive channels and one of the second conductive channels, respectively;
wherein one of the first conductive via structures, the conductive element of one of the pickup heads, and one of the second conductive via structures form a current path, when one of the pickup heads is going to attract one of the light emitting diodes, one of the pickup heads is induced charge for attracting the corresponding light emitting diodes and the corresponding light emitting diodes leaves a temporarily substrate.

8. The operation method of picking and placing by the pickup and placing device as recited in claim 7, wherein when one of the pickup heads attracts one of the light emitting diodes, the second portion are elastically deformed and partly in the buffer region.

9. The operation method of picking and placing by the pickup and placing device as recited in claim 7, wherein a current direction of the current path is changed after one of the pickup heads placing one of the attracted light emitting diodes on the active array substrate.

10. The operation method of picking and placing by the pickup and placing device as recited in claim 7, wherein the control element provides the signal to stop the current and makes the light emitting diode leave the pickup head.

* * * * *